United States Patent
Cheng et al.

(10) Patent No.: US 11,340,531 B2
(45) Date of Patent: May 24, 2022

(54) TARGET CONTROL IN EXTREME ULTRAVIOLET LITHOGRAPHY SYSTEMS USING ABERRATION OF REFLECTION IMAGE

(71) Applicant: TAIWAN SEMICONDUCTOR MANUFACTURING CO., LTD., Hsinchu (TW)

(72) Inventors: Ting-Ya Cheng, Taipei (TW); Han-Lung Chang, Kaohsiung (TW); Shi-Han Shann, Hsinchu (TW); Li-Jui Chen, Hsinchu (TW); Yen-Shuo Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 115 days.

(21) Appl. No.: 16/926,489

(22) Filed: Jul. 10, 2020

(65) Prior Publication Data
US 2022/0011675 A1  Jan. 13, 2022

(51) Int. Cl.
G03F 7/20 (2006.01)
H05G 2/00 (2006.01)
G02B 7/182 (2021.01)

(52) U.S. Cl.
CPC ......... *G03F 7/70033* (2013.01); *G02B 7/182* (2013.01); *G03F 7/7055* (2013.01); *H05G 2/006* (2013.01); *H05G 2/008* (2013.01)

(58) Field of Classification Search
CPC ... G03F 7/70033; G03F 7/7055; G02B 7/182; H05G 2/006; H05G 2/008
See application file for complete search history.

(56) References Cited

U.S. PATENT DOCUMENTS

| | | | |
|---|---|---|---|
| 7,164,144 B2 | 1/2007 | Partlo et al. | |
| 7,230,964 B2 | 6/2007 | Das et al. | |
| 8,324,600 B2 | 12/2012 | Hayashi et al. | |
| 8,461,560 B2 | 6/2013 | Ershov et al. | |
| 8,796,666 B1 | 8/2014 | Huang et al. | |
| 8,969,840 B2 | 3/2015 | Rajyaguru et al. | |
| 9,093,530 B2 | 7/2015 | Huang et al. | |
| 9,097,978 B2 | 8/2015 | Huang et al. | |
| 9,184,054 B2 | 11/2015 | Huang et al. | |
| 9,256,123 B2 | 2/2016 | Shih et al. | |
| 9,265,136 B2 | 2/2016 | Hori et al. | |
| 9,497,840 B2 | 11/2016 | Wehrens | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,832,853 B2 | 11/2017 | Graham et al. | |
| 9,869,928 B2 | 1/2018 | Huang et al. | |

(Continued)

FOREIGN PATENT DOCUMENTS

TW  I420251 B  12/2013

*Primary Examiner* — Nicole M Ippolito
*Assistant Examiner* — Hanway Chang
(74) *Attorney, Agent, or Firm* — McDermott Will & Emery LLP

(57) ABSTRACT

A method of controlling an extreme ultraviolet (EUV) lithography system is disclosed. The method includes irradiating a target droplet with EUV radiation, detecting EUV radiation reflected by the target droplet, determining aberration of the detected EUV radiation, determining a Zernike polynomial corresponding to the aberration, and performing a corrective action to reduce a shift in Zernike coefficients of the Zernike polynomial.

20 Claims, 14 Drawing Sheets

(56) References Cited

U.S. PATENT DOCUMENTS

| | | |
|---|---|---|
| 9,869,934 B2 | 1/2018 | Huang et al. |
| 9,869,939 B2 | 1/2018 | Yu et al. |
| 2006/0002113 A1 | 1/2006 | Chandhok et al. |
| 2007/0007469 A1 | 1/2007 | Murakami et al. |
| 2012/0062864 A1 | 3/2012 | Kawabe |
| 2012/0305811 A1 | 12/2012 | Wakabayashi et al. |
| 2013/0141709 A1 | 6/2013 | Loopstra et al. |
| 2014/0084183 A1 | 3/2014 | Wakabayashi et al. |
| 2014/0333915 A1 | 11/2014 | Hoogkamp et al. |
| 2016/0073487 A1 | 3/2016 | Yanagida et al. |
| 2017/0325325 A1 | 11/2017 | Lambert et al. |
| 2018/0330249 A1 | 11/2018 | Hajiyev et al. |
| 2019/0101831 A1 | 4/2019 | Chung et al. |
| 2020/0103746 A1 | 4/2020 | Huang et al. |

TARGET CONTROL IN EXTREME ULTRAVIOLET LITHOGRAPHY SYSTEMS USING ABERRATION OF REFLECTION IMAGE

BACKGROUND

The wavelength of radiation used for lithography in semiconductor manufacturing has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

One method for producing EUV radiation is laser-produced plasma (LPP). In an LPP-based EUV source, a high-power laser beam is focused on small droplet targets of metal, such as tin, to form a highly ionized plasma that emits EUV radiation with a peak maximum emission at 13.5 nm. The intensity of the EUV radiation produced by LPP depends on the effectiveness with which the high-powered laser can produce the plasma from the droplet targets. Precise synchronization of the pulses of the high-powered laser with generation and movement of the droplet targets is desired to improve the efficiency of an LPP-based EUV radiation source.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, 2D, 2E, and 2F schematically illustrate the movement of target droplet by the pre-pulse in X-Z and X-Y planes respectively.

DETAILED DESCRIPTION

Figure 1:
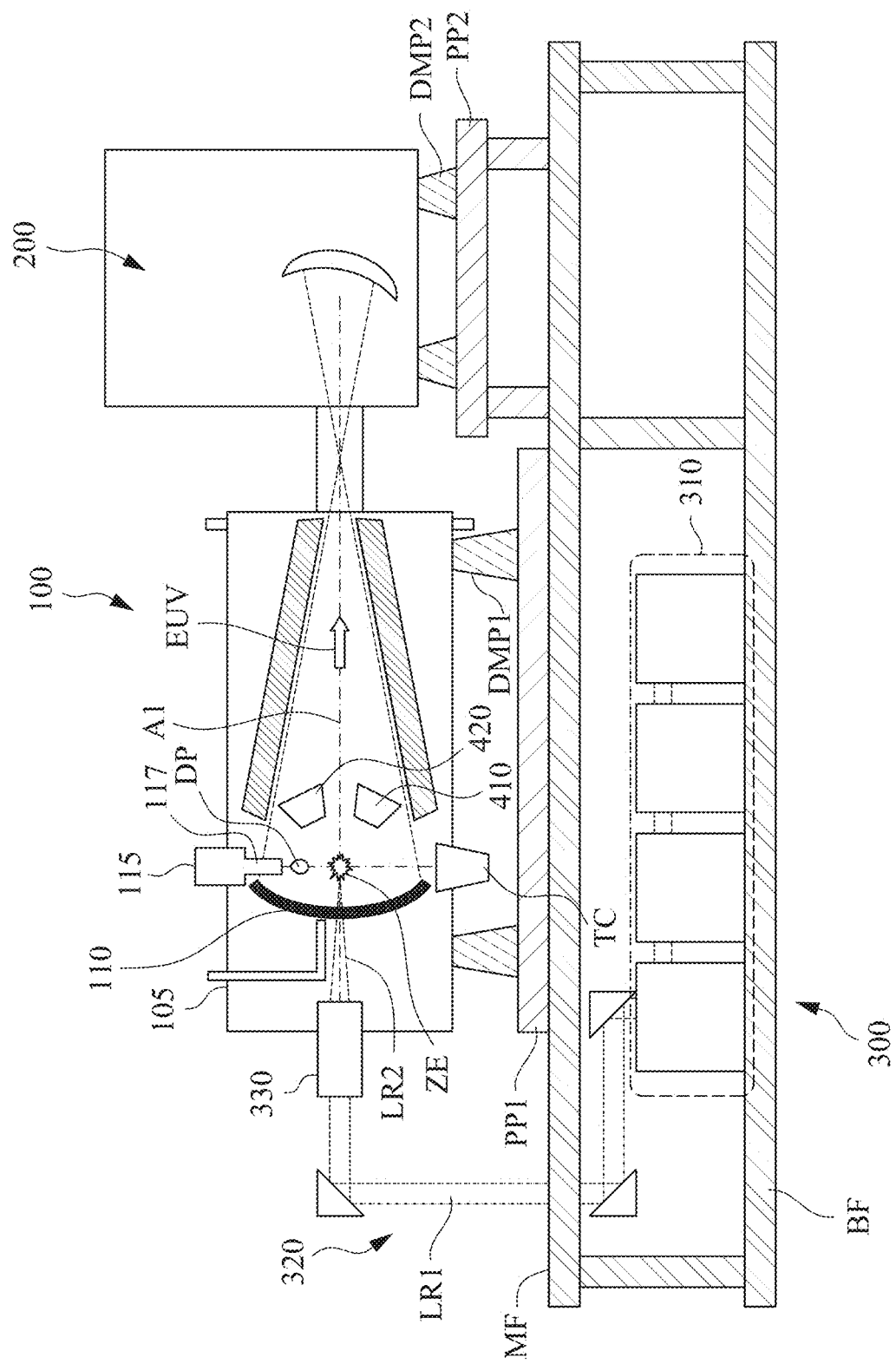
FIG. 1 is a schematic view of an EUV lithography system with a laser produced plasma (LPP)-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

The present disclosure is generally related to extreme ultraviolet (EUV) lithography systems and methods. More particularly, it is related to apparatuses and methods for improved target control to obtained increased EUV energy by controlling an excitation laser used in a laser produced plasma (LPP)-based EUV radiation source. The excitation laser heats metal (e.g., tin) target droplets in the LPP chamber to ionize the droplets to a plasma which emits the EUV radiation. For increased EUV energy, a majority of the excitation laser has to be incident on the target droplets to improve EUV output and conversion efficiency. Thus, the shape of the excitation laser, the angle of incidence of the excitation laser, and the profile of the laser beam has to be considered in order to obtain increased EUV energy.

Existing methods consider the relative position between the target droplets and the excitation laser without considering the shape of the excitation laser, change in the angle of incidence of the excitation laser (also referred to as pointing error), and the profile of the laser beam. Thus, EUV energy drop due to these issues are not detected. Since these issues cannot be detected, the excitation laser control system and/or the droplet generator cannot be controlled to address these issues and thereby compensate for the reduced EUV energy.

Embodiments of the present disclosure are directed to controlling the relative position (e.g., direction of travel) of the excitation laser and the position of the target droplet based on the angle of incidence of the laser beam on the target droplet and the profile of the laser beam.

FIG. 1 is a schematic view of an EUV lithography system with a laser produced plasma (LPP)-based EUV radiation source, in accordance with some embodiments of the present disclosure. The EUV lithography system includes an EUV radiation source 100 to generate EUV radiation, an exposure tool 200, such as a scanner, and an excitation laser source 300. As shown in FIG. 1, in some embodiments, the EUV radiation source 100 and the exposure tool 200 are installed on a main floor MF of a clean room, while the excitation laser source 300 is installed in a base floor BF located under the main floor. Each of the EUV radiation source 100 and the exposure tool 200 are placed over pedestal plates PP1 and PP2 via dampers DMP1 and DMP2, respectively. The EUV radiation source 100 and the exposure tool 200 are coupled to each other by a coupling mechanism, which may include a focusing unit.

The lithography system is an extreme ultraviolet (EUV) lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In an example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optical components, such as convex/concave/flat mirrors, a mask holding mechanism including a mask stage, and wafer holding mechanism. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. In an embodiment, the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a laser produced plasma (LPP) collector 110, enclosed by a chamber 105. The target droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds. The remnants (residue) after the interaction of the target droplets DP with the excitation laser LR2 are collected in a tin catcher TC located below the target droplet generator 115.

The excitation laser LR2 generated by the excitation laser source 300 is a pulse laser. The laser pulses LR2 are generated by the excitation laser source 300. The excitation laser source 300 includes a laser generator 310, laser guide optics 320, and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure tool 200.

Figure 2A:
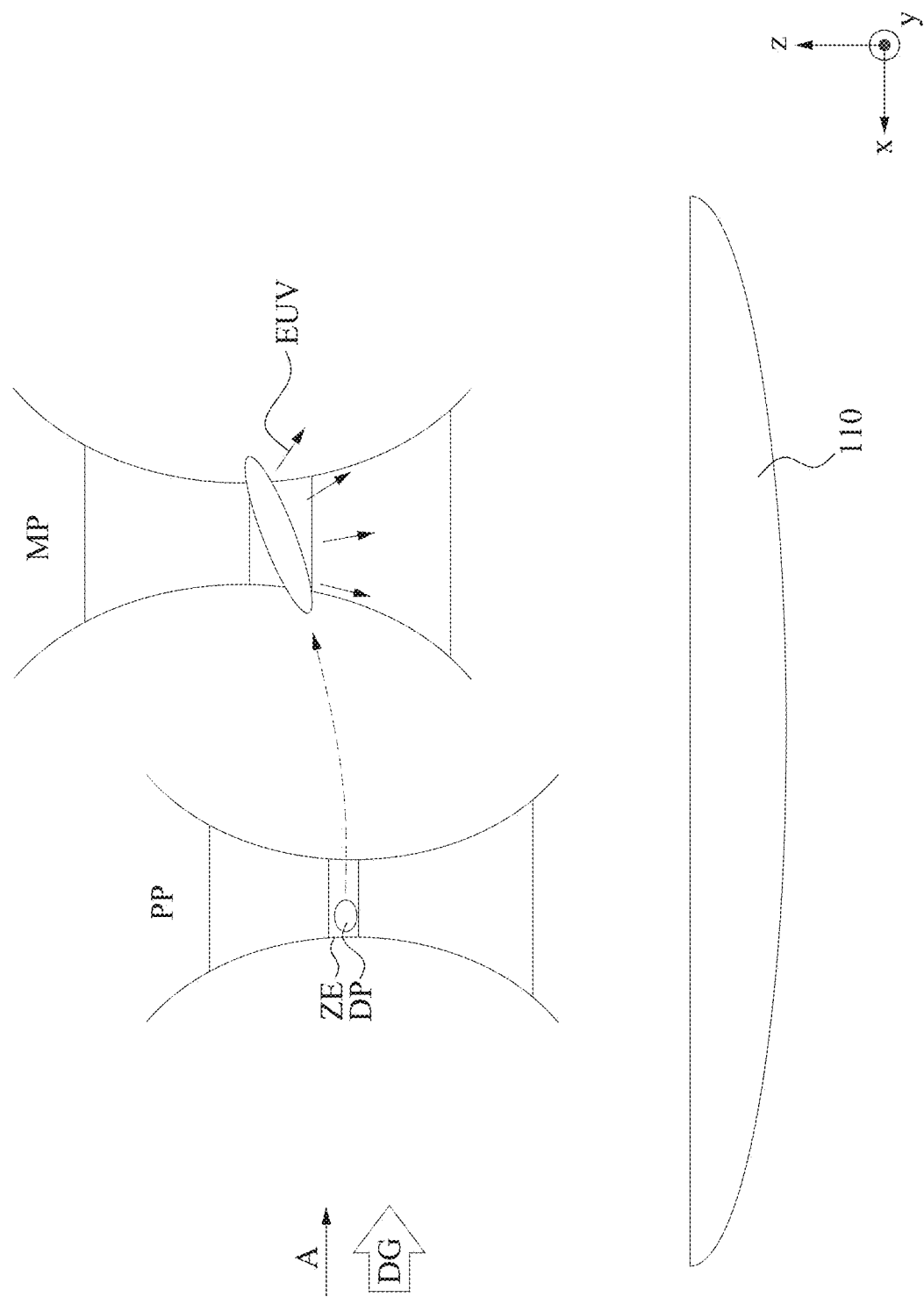

FIG. 2A schematically illustrates the movement of target droplet DP relative to the collector 110 after being irradiated by the pre-pulse PP. A target droplet DP is sequentially irradiated by the pre-pulse PP and the main pulse MP. When the target droplet DP travels along X-axis in a direction "A" from the droplet generator DG to the zone of excitation ZE, the pre-pulse PP exposing the target droplet DP causes the target droplet DP to change its shape into, for example, a pancake and introduce a Z-axis component to its direction of travel in the X-Z plane.

The laser-produced plasma (LPP) generated by irradiating the target droplet DP with the laser beams PP, MP presents certain timing and control problems. The laser beams PP, MP must be timed so as to intersect the target droplet DP when it passes through the targeted point. The laser beams PP, MP must be focused on each of their focus positions, respectively, where the target droplet DP will pass. The position of the zone of excitation ZE and parameters such as, for example, laser power, time delay between the main pulse and the pre-pulse, focal point of the pre-pulse and/or main pulse, may be determined when an EUV radiation source 100 is set up. The actual position of the zone of excitation ZE and the aforementioned parameters are then adjusted during wafer exposure using a feedback mechanism in various embodiments. However, these parameters can change over time due to various factors such as, for example, separation between the main pulse MP and the pre-pulse PP, shape of the excitation laser, the profile of the laser beam, mechanical and/or electrical drift in the radiation source, instability of the droplet generator, changes in chamber environment.

FIG. 2B illustrates an exemplary optical metrology for misalignment in the x-axis OMX. OMX is defined by a distance in the x-axis between a droplet and the focal point of the pre-pulse PP. Similarly, FIG. 2C illustrates an exemplary optical metrology for misalignment in the y-axis OMY. OMY is defined by a distance in the y-axis between the droplet and the focal point of the pre-pulse PP. FIG. 2D further illustrates an exemplary optical metrology for misalignment in the z-axis OMZ. Similar to OMX and OMY, OMZ is defined by a distance in the z-axis between a droplet and the focal point of the pre-pulse PP. FIG. 2E illustrates an exemplary optical metrology for misalignment in radius OMR. The x-axis is in the direction of motion by the droplet from the droplet generator 115. The z-axis is along the optical axis A1 (FIG. 1) of the collector mirror 110. The y-axis is perpendicular to the x-axis and the z-axis.

Figure 2F:
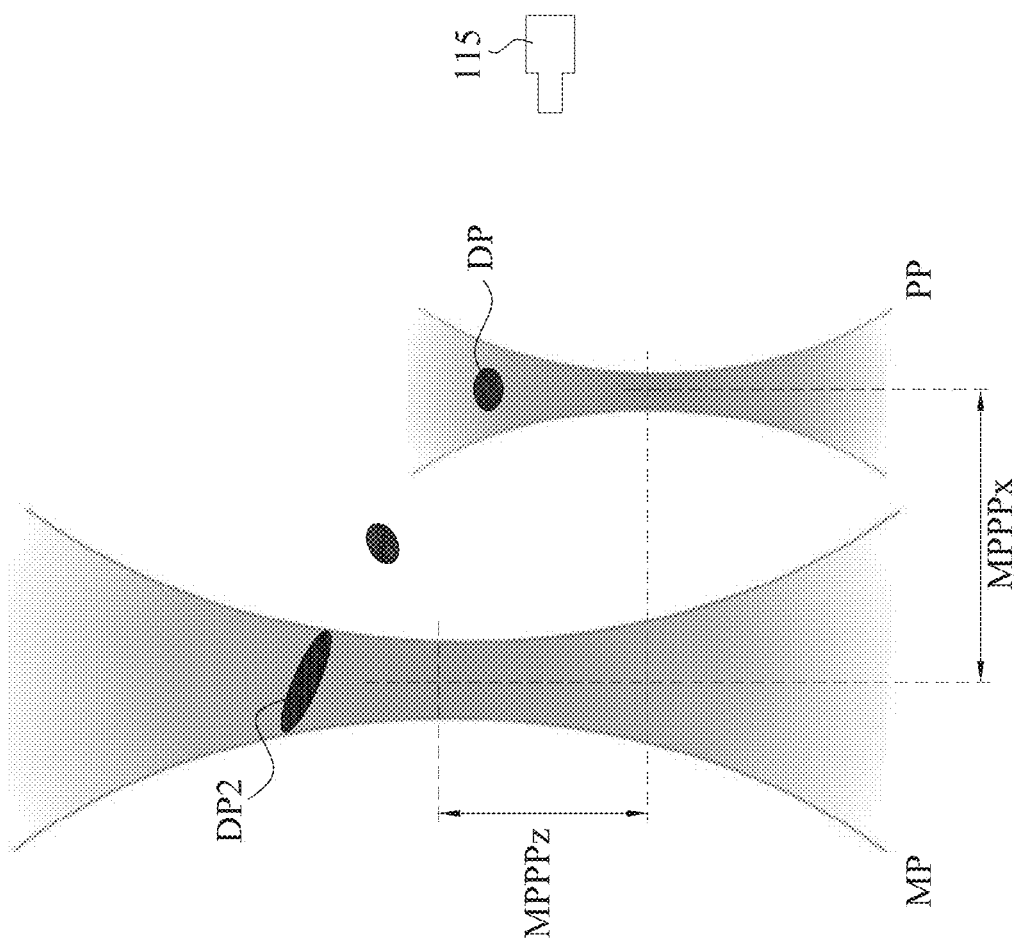

As shown in FIG. 2F, the target droplet DP is ejected from a droplet generator 115 travelling in a direction to a tin catcher TC. When such mechanical and/or electrical drift occurs in the radiation source, the pre-pulse laser PP causes the target droplet DP to expand in a direction with an angle with respect to a direction of incidence from the pre-pulse laser beam. This gives a rise to a target droplet DP2 which has expanded to form a football-like shape shown in FIG. 2E. In such an embodiment, a spatial separation between the pre-pulse PP and the main-pulse MP, MPPP separation, is defined as a distance between the focal point of the pre-pulse PP and the focal point of the main-pulse MP, which is a 3-D vector contributed by x, y, and z sections. For example, as shown in FIG. 2F, MPPPx is a distance along the x-axis of the MPPP separation and MPPPz is a distance along the z-axis of the MPPP separation.

Figure 3:
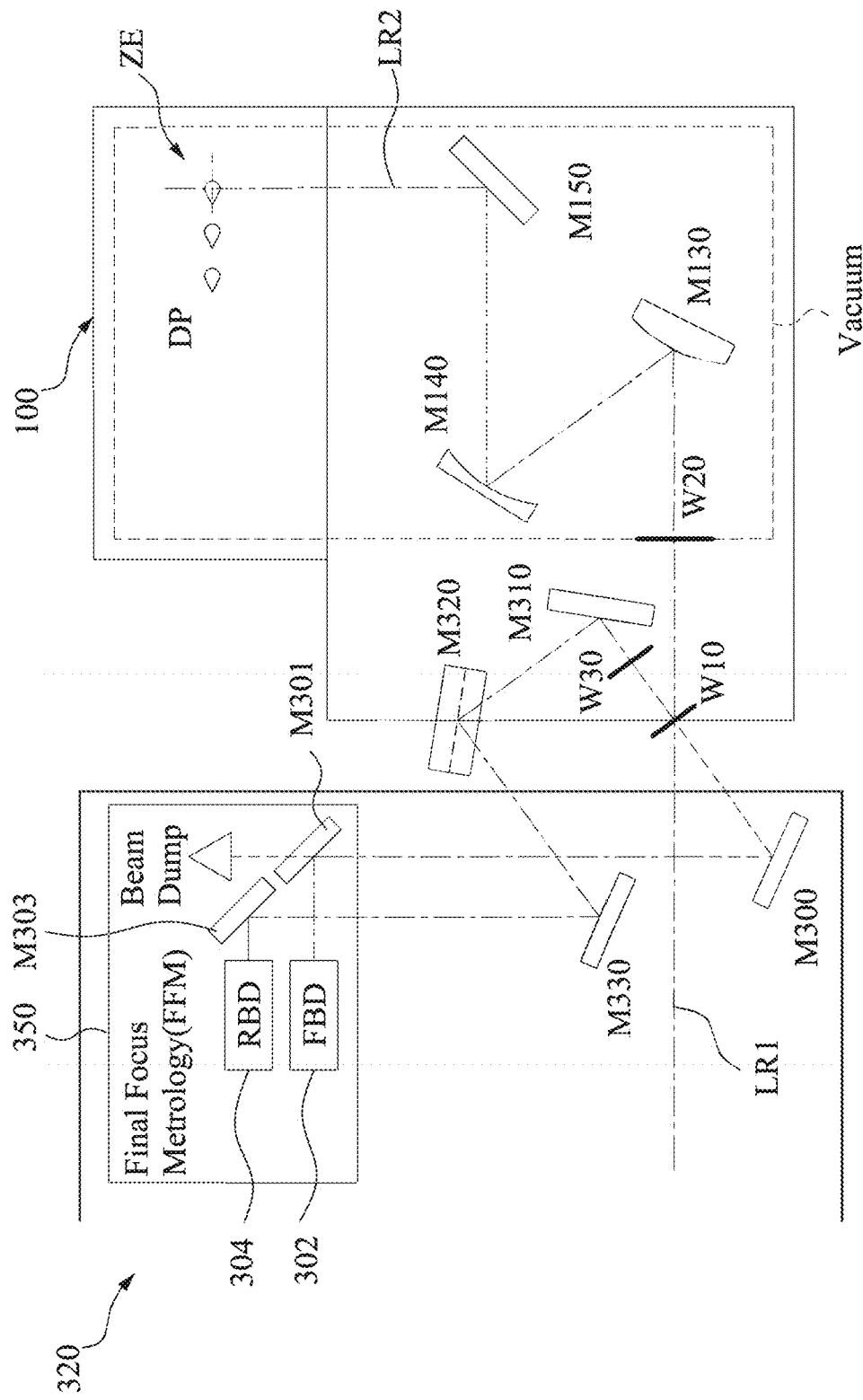
FIG. 3 schematically illustrates the laser guide optics and the focusing apparatus used in the EUV lithography system illustrated in FIG. 1, in accordance with an embodiment.

FIG. 3 schematically illustrates the laser guide optics 320 and the focusing apparatus 330 used in the EUV lithography system illustrated in FIG. 1, in accordance with an embodiment. As illustrated, the laser guide optics 320 includes a forward beam diagnostic (FBD) 302, a return beam diagnostic (RBD) 304, and a plurality of mirrors M301, M303, M300, and M330. The forward beam diagnostic 302 and the return beam diagnostic 304 include a device such as wavefront sensor for measuring the aberrations of an optical wavefront. Some non-limiting types of wavefront sensors include a Shack-Hartmann wavefront sensor, a phase-shifting Schlieren technique, a wavefront curvature sensor, a pyramid wavefront sensor, a common-path interferometer, a Foucault knife-edge test, a multilateral shearing interferometer, a Ronchi tester, and a shearing interferometer.

The forward beam diagnostic 302 and the return beam diagnostic 304, and mirrors M301, M303 constitute a final focus metrology (FFM) module 350. The signal from the final focus metrology (FFM) module 350 is used as a control signal and may be connected with an actuator to control one of the mirrors of the focusing apparatus 330, such as for example, the mirror M150 in the optical path before the laser hits the target droplets DP. In some embodiments, the mirror M150 is the last mirror before the laser hits the target droplets DP. The mirror M150 is a steerable mirror and is adjustable in 3 axis.

The mirrors M301, M303, M300, and M330 are arranged (or otherwise configured to) guide incident laser light in a desired direction. The focusing apparatus 330 includes a plurality of mirrors M310, M320, M130, M140, and M150. The mirrors M310, M320, M130, M140, and M150 are arranged (or otherwise configured to) guide incident laser light in a desired direction. The focusing apparatus 330 also includes windows W10, W20, and W30. The windows W10 and W20, and mirrors M310 and M320 are in an environment that is under atmospheric pressure conditions. The mirrors M130, M140, and M150 are in vacuum. The window W10 is located at an entry point into the focusing apparatus 330 and receives laser light from the laser guide optics 320. The window W20 is located between the atmospheric pressure environment and vacuum.

The forward beam diagnostic 302 receives the laser light LR1 generated by the laser generator 310. The forward beam diagnostic 302 analyzes the laser light LR1 generated by the laser generator 310. Some of the laser light LR1 is guided from the window W10 of the focusing apparatus 330 on to the mirror M300. From the mirror M300, the laser light LR1 is incident on the mirror M301. The laser light LR1 is guided by the mirror M301 to the forward beam diagnostic 302. Thus, the forward beam diagnostic 302 receives the laser light LR1 before the laser light LR1 interacts with the target droplets DP. The forward beam diagnostic 302 analyzes the wavefront of the laser light LR1.

As illustrated, the laser light LR1 passes through the window W10 and window W20 of the focusing apparatus 330 and is incident on the mirror M130. The mirror M130 is arranged (or otherwise configured) such that the laser light LR1 is reflected on to the mirror M140. The mirror M140 is arranged (or otherwise configured) such that the laser light LR1 received from the mirror M130 is reflected on to the mirror M150. The mirror M150 is arranged (or otherwise configured) such that the laser light LR1 obtained from the mirror M140 is reflected on to the target droplets DP. The laser light thus guided by the mirrors M130, M140, and M150 is focused into the excitation laser LR2 by the focusing apparatus 330, and then introduced into the EUV radiation source 100 (FIG. 1).

After interacting with the target droplets DP, the excitation laser LR2 is dispersed and a return beam of excitation laser LR2 is guided back to window W10 via the mirrors M150, M140, and M130 and window W20. From the window W10, the return beam of excitation laser LR2 travels to mirror M310 via window W30. In some embodiments, the window W10 is a diamond window. The mirror M310 guides the return beam to mirror M303 via mirrors M320 and M330. The return light is guided to the return beam diagnostic 304 using mirror M303. The return beam diagnostic 304 receives the return beam and analyzes the return beam, more specifically, the optical wavefront of the return beam.

In analyzing the return beam of excitation laser LR2, the return beam diagnostic 304 generates a plurality of Zernike polynomials. Each Zernike polynomial describes specific form of surface deviation that can be fit to specific forms of wavefront deviations (aberrations). By including a plurality of Zernike polynomials (commonly referred to as terms), wavefront deformation can be described to a desired degree of accuracy.

Figure 4:
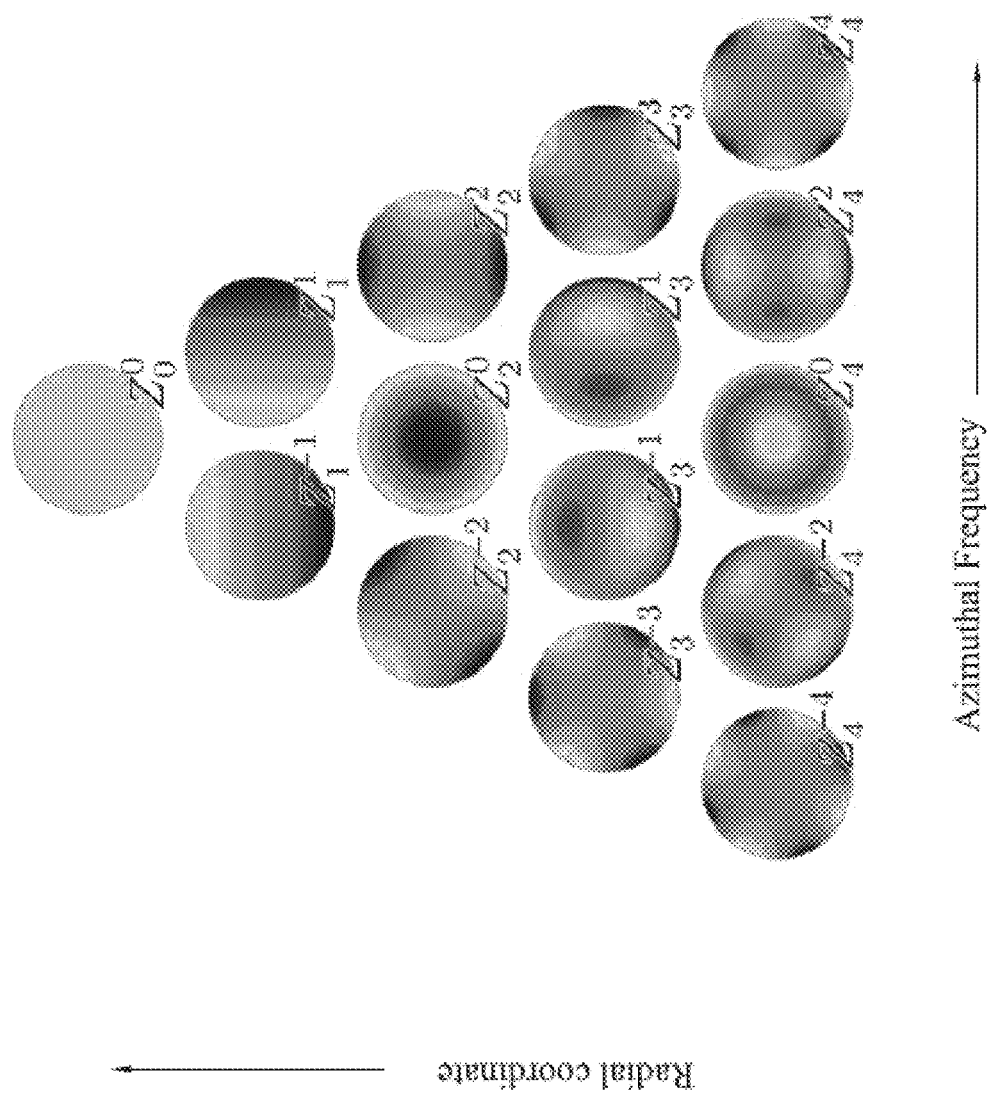
FIG. 4 illustrates the first 15 Zernike polynomials ordered vertically by radial degree and horizontally by azimuthal frequency.

FIG. 4 illustrates the first 15 Zernike polynomials ordered vertically by radial degree and horizontally by azimuthal frequency. Table 1 below lists the different Zernike polynomials and the aberration type obtained from each polynomial.

TABLE 1

| Zernike Polynomial | Index | Aberration Type |
| --- | --- | --- |
| $Z_0^0$ | 1 | Piston |
| $Z_1^1$ | 2 | Tip (X-Tilt, horizontal tilt) |
| $Z_1^{-1}$ | 3 | Tilt (Y-Tilt, vertical tilt) |
| $Z_2^0$ | 4 | Defocus |

TABLE 1-continued

| Zernike Polynomial | Index | Aberration Type |
| --- | --- | --- |
| $Z_2^{-2}$ | 5 | Oblique Astigmatism |
| $Z_2^2$ | 6 | Vertical Astigmatism |
| $Z_3^{-1}$ | 7 | Vertical Coma |
| $Z_3^1$ | 8 | Horizontal Coma |
| $Z_3^{-3}$ | 9 | Vertical Trefoil |
| $Z_3^3$ | 10 | Horizontal Trefoil |
| $Z_4^0$ | 11 | Primary Spherical |
| $Z_4^2$ | 12 | Vertical secondary astigmatism |
| $Z_4^{-2}$ | 13 | Oblique secondary astigmatism |
| $Z_4^4$ | 14 | Vertical quadrafoil |
| $Z_4^{-4}$ | 15 | Oblique quadrafoil |

Figure 5:
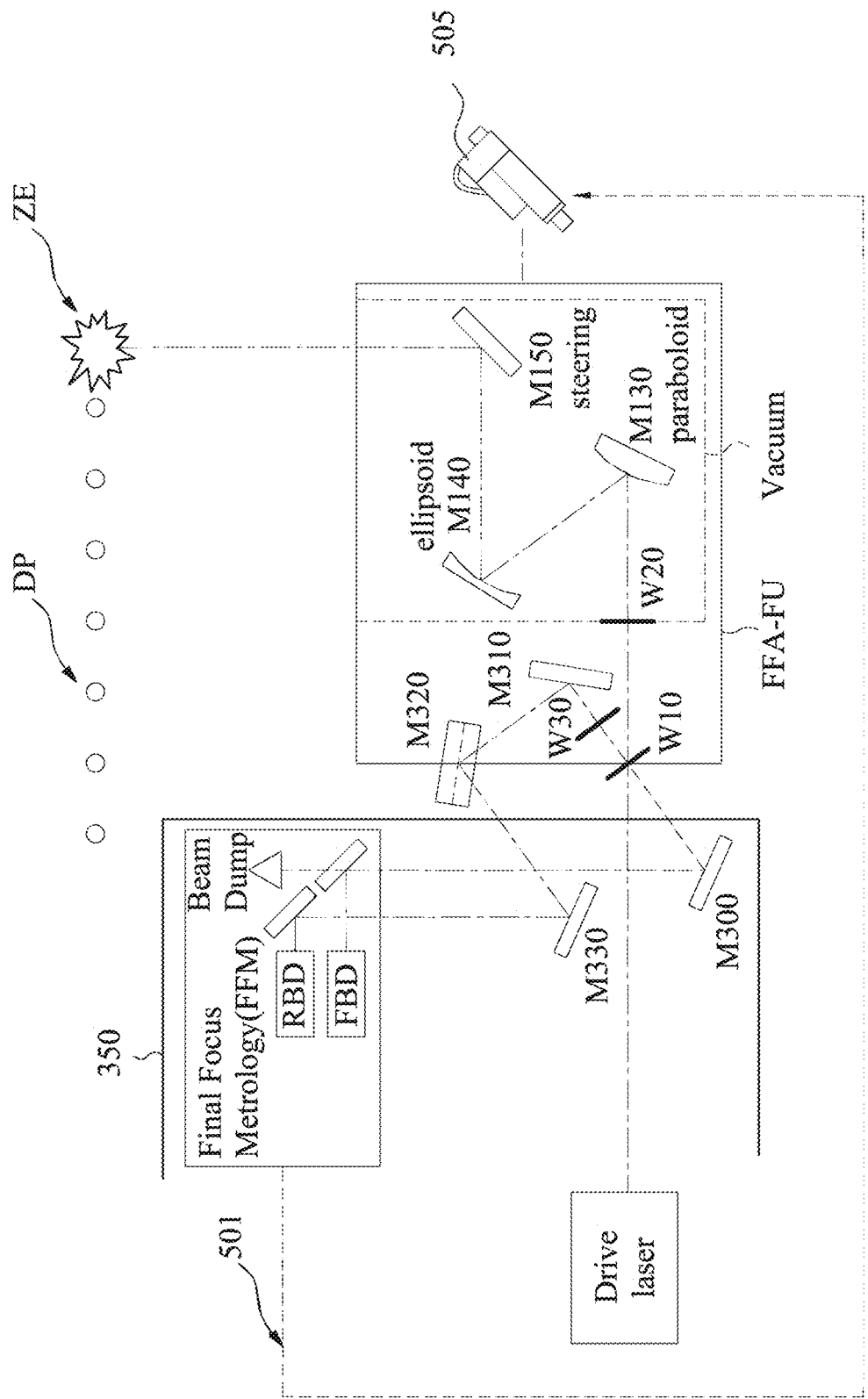
FIG. 5 shows an exemplary schematic view of the EUV lithography system illustrated in FIG. 1.

The return beam diagnostic 304 is configured to measure aberration of the received wavefront (radiation) of the return beam of excitation laser LR2 and quantify the aberration using the Zernike polynomials. The return beam diagnostic 304 analyzes the received wavefront to determine the Zernike coefficients of the Zernike polynomial that best fits the specific wavefront deviation. Based on the shift in the Zernike coefficients, the change in the beam profile can be determined. FIG. 5 shows an exemplary schematic view of the EUV lithography system illustrated in FIG. 1. As illustrated, a control signal 501 corresponding to the change in the beam profile is generated by the final focus metrology (FFM) module 350. As discussed above, the control signal 501 is connected with an actuator 505 to control one of the mirrors of the focusing apparatus 330, such as for example, the mirror M150 in the optical path before the laser hits the target droplets DP. Thus, by using the control signal 501, the targeting control is optimized to maximize generation of EUV energy.

In some embodiments, the feedback mechanism, illustrated in FIG. 5, may further send a notification based on the change in the beam profile. In some embodiments, the notification includes a spatial separation between the pre-pulse and the main-pulse. In some embodiments, the notification also includes a time delay between the pre-pulse and the main-pulse. In some embodiments, the notification also includes an angle of a steerable mirror coupled to the radiation source. In some embodiments, based on the generating the notification, the feedback further sends the notification to a first external device associated with a steerable mirror controller and a second external device associated with a time delay controller.

Figure 6:
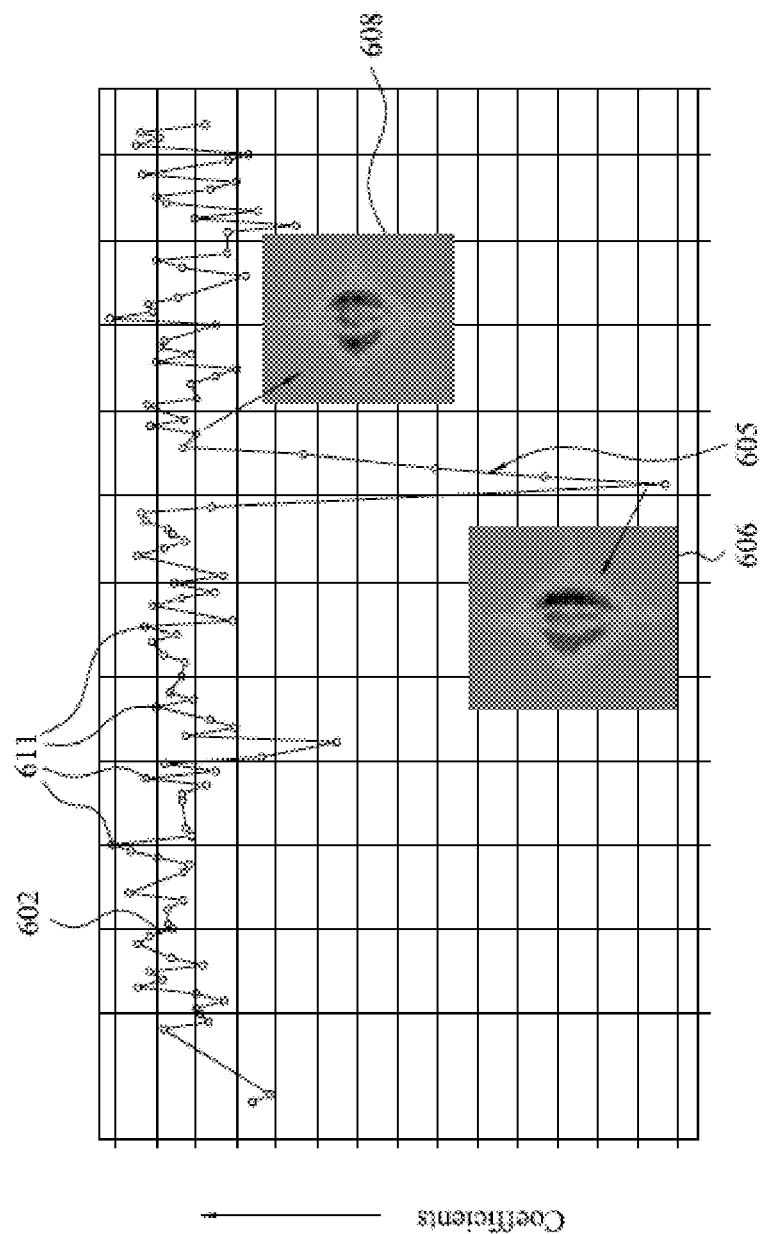
FIG. 6 is a graph indicating variation in the coefficients of the $4^{th}$ Zernike polynomial as determined by measurements using the return beam diagnostic, according to embodiments of the disclosure.

FIG. 6 is a graph 600 indicating variation in the Zernike coefficients of the 4th Zernike polynomial as determined by measurements using the return beam diagnostic 304, according to embodiments of the disclosure. In the embodiment illustrated in FIG. 6, the return beam diagnostic 304 analyzes the wavefront of the return beam of excitation laser LR2 and determines that the excitation laser LR2 incident on the target droplets DP has an aberration of the type defocus, which corresponds to the 4th Zernike polynomial. The return beam diagnostic 304 determines the variation (line 602) in the Zernike coefficients 611 of the 4th Zernike polynomial. The variation in the Zernike coefficients 611 within a desired range is considered acceptable and no corrective action is performed. However, for a variation beyond the desired range, as indicated by the dip 605 in the line 602, one or more corrective actions are undertaken. A corrective action includes actuating the actuator 505 to change a position of the mirror M150 based on the control signal 501. Alternatively or additionally, one or more of the OMX, OMY and OMZ distances can be adjusted to minimize the change in the beam profile and thereby improve the interaction between the excitation laser LR2 and the target droplets DP.

Also illustrated are the images 606 and 608 obtained by the return beam diagnostic 304 before and after the dip 605, respectively. As illustrated, the defocus aberration determined in image 606 is reduced in image 608 due to the corrective actions. The example in FIG. 6 illustrates how the $4^{th}$ Zernike polynomial can be used to detect the defocus aberrations in the optical wavefront, according to embodiments. However, embodiments are not limited thereto. Other Zernike polynomials can be used to detect corresponding aberrations, and one or more corrective actions can be taken to mitigate the detected aberrations. Thus, by improving the interaction between the target droplets and the excitation laser LR2, the conversion efficiency can be maximized, and variations (fluctuations) in the EUV energy can be minimized.

Figure 7:
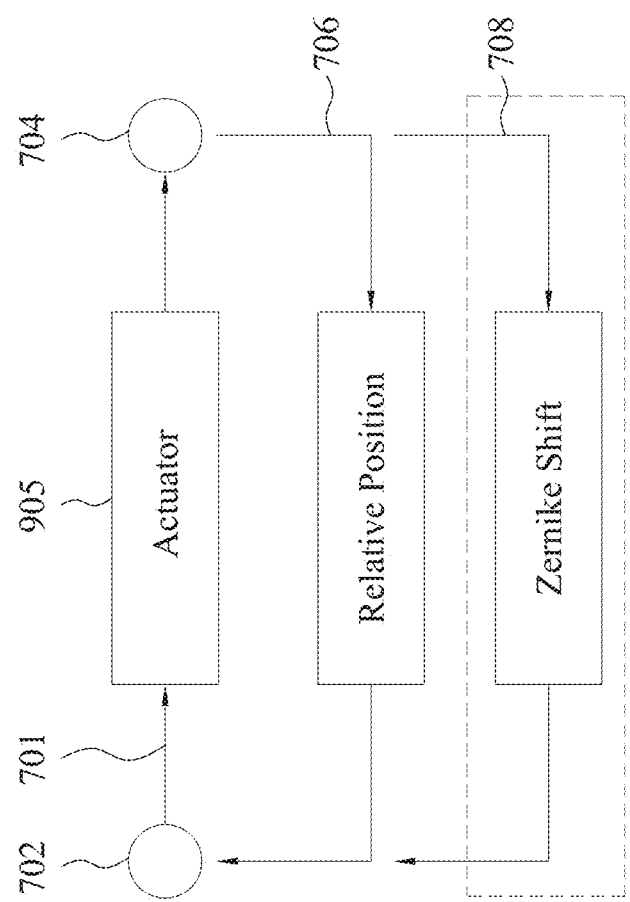
FIG. 7 illustrates signal flow in the EUV lithography system illustrated in FIG. 5, according to embodiments of the disclosure.

FIG. 7 illustrates signal flow in the EUV lithography system illustrated in FIG. 5, according to embodiments of the disclosure. The desired position of the zone of excitation ZE and parameters such as, for example, laser power, time delay between the main pulse and the pre-pulse, focal point of the pre-pulse and/or main pulse, may be determined when an EUV radiation source 100 is set up, and thereby define the set point 702 of the EUV lithography system.

A control signal 701 corresponding to one or more of the parameters is provided to one or more components of the EUV lithography system to control the position of the zone of excitation ZE. For instance, one or more of the position of the droplet generator 115 and trajectory of the excitation laser LR2 are adjusted to maximize the interaction between the target droplets DP and the excitation laser LR2 to maximize the generation of EUV energy. In some embodiments, the control signal 701 is the control signal 501 provided to the actuator 505 to control one of the mirrors of the focusing apparatus 330, such as for example, the mirror M150 in the optical path before the excitation laser LR2 hits the target droplets DP.

However, these parameters can change over time due to various factors such as, for example, separation between the main pulse MP and the pre-pulse PP, shape of the excitation laser, the profile of the laser beam, mechanical and/or electrical drift in the radiation source, instability of the droplet generator, changes in chamber environment.

The interaction between the excitation laser LR2 and the target droplets DP is analyzed at 704. The target droplets DP reflect and/or scatter the light (excitation laser LR2, in this case) incident upon it. The reflected and/or scattered light is detected for example, at a droplet detection module 420 (FIG. 1). In some embodiments, the droplet detection module 420 includes a photodiode designed to detect light having a wavelength of the light from a droplet illumination module 410 (FIG. 1). In various embodiments, the droplet illumination module 410 is a continuous wave laser or a pulsed laser having emitting light of a desired wavelength.

It is determined whether an intensity of the detected light (i.e., light reflected and/or scattered by the target droplet) is within an acceptable range. In some embodiments, the determination is based on a value of current and/or voltage produced by photodiode of the droplet detection module 420 when it receives the light reflected and/or scattered by the target droplet DP. In some embodiments, the droplet detection module 420 includes a logic circuit programmed to generate a prescribed signal 706 when the detected intensity is not within an acceptable range. For example, the prescribed signal 706 is generated when the detected intensity is less than a certain threshold value. The prescribed signal 706 is indicative of the relative position of the excitation laser LR2 and the target droplets DP.

If the intensity of the detected light is not within the acceptable range, a parameter of the droplet illumination module 410 is adjusted (e.g., automatically) to increase or decrease the intensity of light irradiating the target droplet so as to ultimately bring the intensity of the detected light within the acceptable range.

In various embodiments, the parameter of the droplet illumination module 410 includes, for example, an input voltage and/or current to the light source (e.g., laser) in the droplet illumination module 410, a width of a slit controlling the amount of light exiting the droplet illumination module 410, an aperture of the droplet illumination module 410, and a value of angle and/or tilt of the droplet illumination module 410. In some embodiments, the parameter is adjusted using a controller that is programmed to control various parameters of the droplet illumination module 410. For example, in an embodiment, the controller is coupled to a slit controlling the amount of light exiting the droplet illumination module 410 and/or a mechanism that controls the tilt/angle of the droplet illumination module 410. In such embodiments, the controller is coupled to the droplet detection module 420 and adjusts the width of the slit and/or the tilt of the droplet illumination module 410 in response to the prescribed signal 706 generated by the droplet detection module 420 when the intensity of the detected light is not within the acceptable range. In other embodiments, the controller is coupled to the actuator 505 and provides control signal 701 to the actuator 505 to control one of the mirrors of the focusing apparatus 330, such as for example, the mirror M150 in the optical path before the laser hits the target droplets DP.

In some embodiments, the controller is a logic circuit programmed to receive the prescribed signal 706 from the droplet detection module 420, and depending on the prescribed signal 706 transmit control signals to one or more components (e.g., the slit and/or tilt control mechanism described elsewhere herein) of the droplet illumination module 410 to automatically adjust one or more parameters of the droplet illumination module 410 and/or to adjust one of the mirrors of the focusing apparatus 330.

Figure 8:
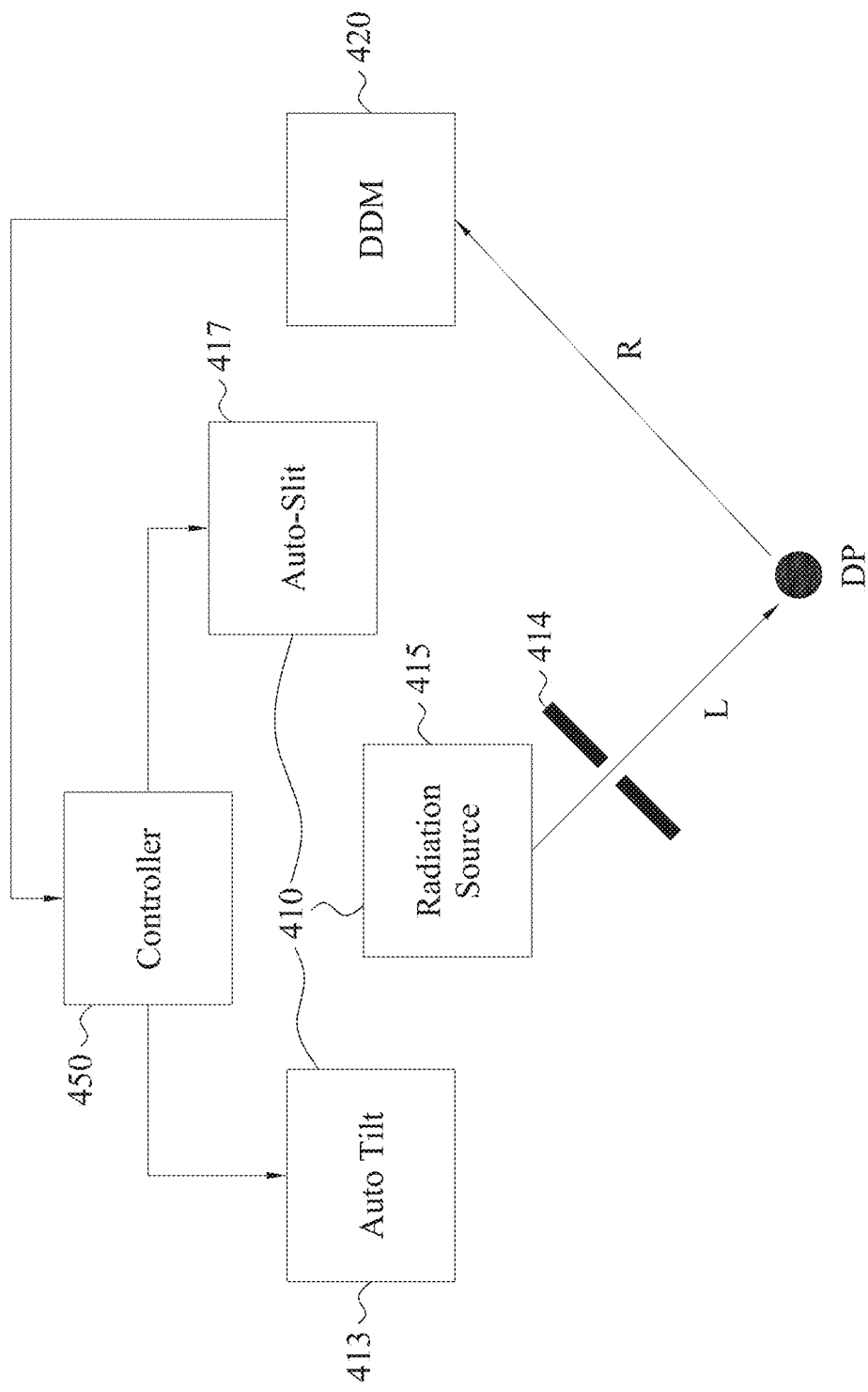
FIG. 8 illustrates a droplet illumination module including a radiation source, a tilt control mechanism, and a slit control mechanism.

Referring briefly to FIG. 8, illustrated is the droplet illumination module 410 including a radiation source 415, a tilt control mechanism 413 and a slit control mechanism 417. The tilt control mechanism 413 (also referred to herein as "auto tilt") controls the tilt of the radiation source 415. In various embodiments, the auto tilt 413 is a stepper motor coupled to the radiation source 415 (e.g., laser) of the droplet illumination module 410 and moves the radiation source 415 to change the angle of incidence at which light (or radiation) L is incident on the target droplet DP (and in effect changing the amount of light R reflected and/or scattered by the target droplet DP into the droplet detection module 420). In some embodiments, the auto tilt 413 includes a piezoelectric actuator.

The slit control mechanism 417 (also referred to herein as "auto slit") controls the amount of light exiting the radiation source 415. In an embodiment a slit or an aperture 414 is disposed between the radiation source 415 and the zone of excitation ZE at which the target droplet DP is irradiated. When, for example, the controller 450 determines that the intensity of light detected at droplet detection module 420 is lower than the acceptable range, the controller 450 moves the slit control mechanism 417 such that a wider slit is provided in the path of light exiting the radiation source 415, allowing more light to irradiate the target droplet DP and increasing the detected intensity. On the other hand, if it is determined that the intensity of light detected at the droplet detection module 420 is higher than the acceptable range, the controller 450 moves the slit control mechanism 417 such that a narrower slit is provided in the path of light exiting the radiation source 415, thereby reducing the detected intensity. In such embodiments, parameter of the droplet illumination module 410 adjusted by the controller 450 is the width of the aperture 414 in the path of light L irradiating the target droplet DP.

Returning to FIG. 7, generation of the prescribed signal 706 thus changes the set point 702 of the EUV lithography system. The control signal 701 is correspondingly changed based on the change is the set point 702. The change in the control signal 701 thus actuates the slit control mechanism, tilt control mechanism, and/or the actuator 505 to causing corresponding changes in the amount of light exiting the radiation source 415 and the angle of incidence at which light is incident on the target droplet DP.

In addition to the above techniques to maximize generation of EUV energy, embodiments of the disclosure are also directed to utilizing the Zernike shift in the wavefront of the light reflected after interaction between the excitation laser LR2 and the target droplets DP. More specifically, embodiments measure aberration of the received wavefront (radiation) and quantify the aberration using the Zernike polynomials in order to obtain the Zernike shift in the reflected wavefront. Accordingly, at 704, the return beam diagnostic 304 determines the Zernike shift in the reflected wavefront and a corresponding control signal 708 is generated. In some embodiments, the control signal 708 is the control signal 501 (illustrated in FIG. 5) that corresponds to the change in the beam profile and is generated by the final focus metrology (FFM) module 350. As discussed above, the control signal 501 is connected with the actuator 505 to control one of the mirrors of the focusing apparatus 330, such as for example, the mirror M150 in the optical path before the laser hits the target droplets DP. Thus, the targeting control is optimized to maximize generation of EUV energy.

Figure 9A:
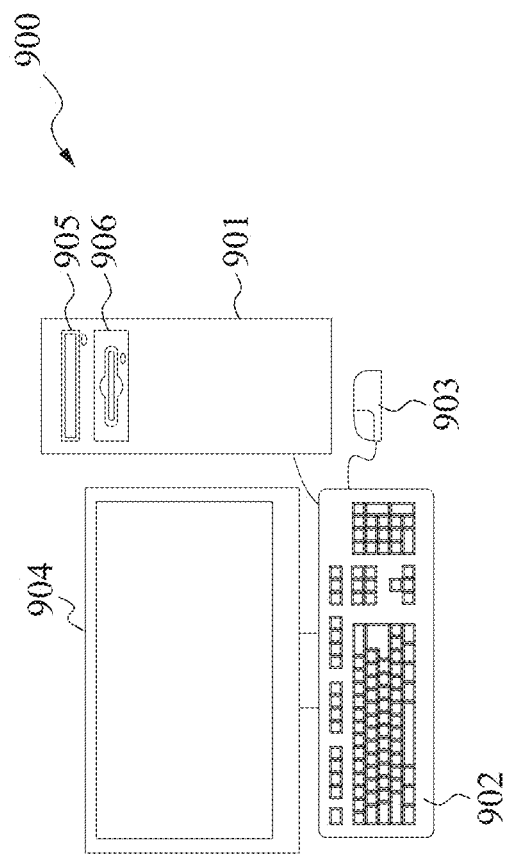
FIGS. 9A and 9B show a EUV data analyzing apparatus according to an embodiment of the present disclosure.
Figure 9B:
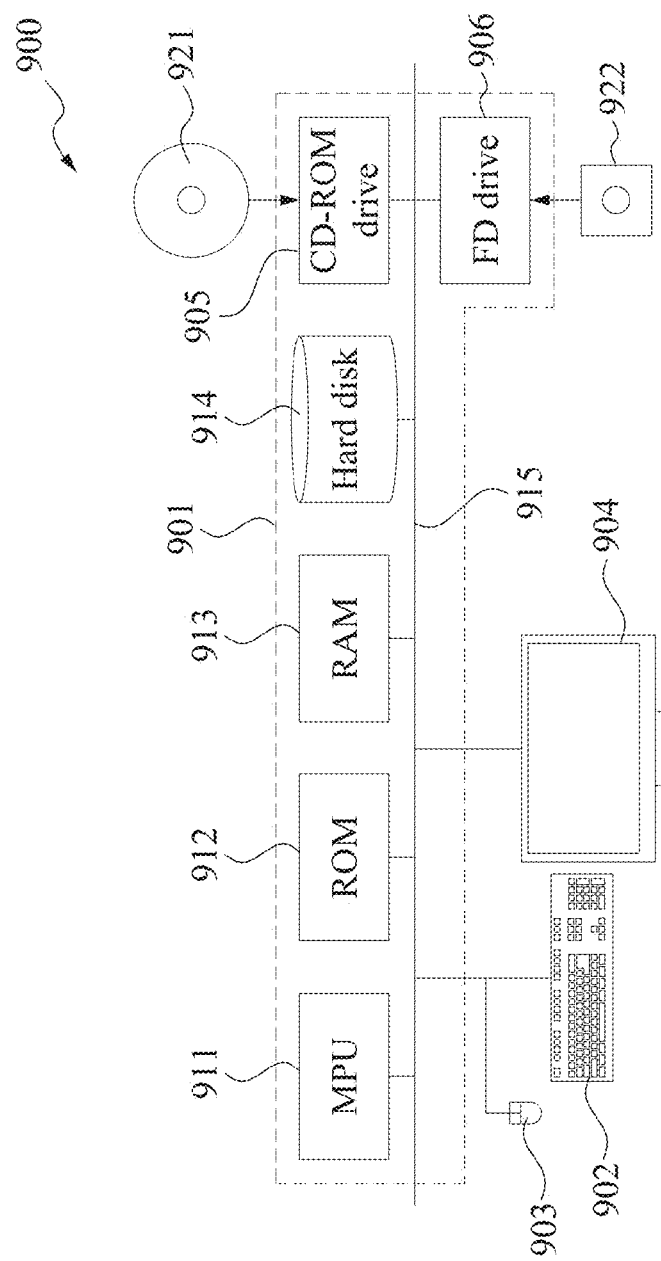

FIGS. 9A and 9B show a EUV data analyzing apparatus according to an embodiment of the present disclosure. FIG. 9A is a schematic view of a computer system that controls an operation of the final focus metrology (FFM) module 350 and the return beam diagnostic 304 for detecting one or more aberrations in the return image and performing one or more corrective actions described above. The foregoing embodiments may be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors 911, such as a micro processing unit (MPU), a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions of the EUV data analyzing apparatus in the foregoing embodiments may be stored in an optical disk 921 or a magnetic disk 922, which are inserted into the optical disk drive 905 or the magnetic disk drive 906, and be transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network.

In the programs, the functions realized by the programs do not include functions that can be realized only by hardware in some embodiments. For example, functions that can be realized only by hardware, such as a network interface, in an acquiring unit that acquires information or an output unit that outputs information are not included in the functions realized by the above-described programs. Furthermore, a computer that executes the programs may be a single computer or may be multiple computers.

Embodiments of the disclosure provide numerous advantages over the existing systems and methods. Zernike terms which correlate with the shift in the X, Y, and/or Z direction of the excitation beam and/or the target droplet direction, and the beam profile change are used to quantify the change in shape of beam and the aberration. By using this as a feedback, an additional feedback loop is generated to compensate the shifting error from the return image instead of only considering relative targeting position. The angle to incidence of the excitation laser is detected and minimized so that a more stable EUV energy can be obtained.

It will be understood that not all advantages have been necessarily discussed herein, no particular advantage is required for all embodiments or examples, and other embodiments or examples may offer different advantages.

Figure 10:
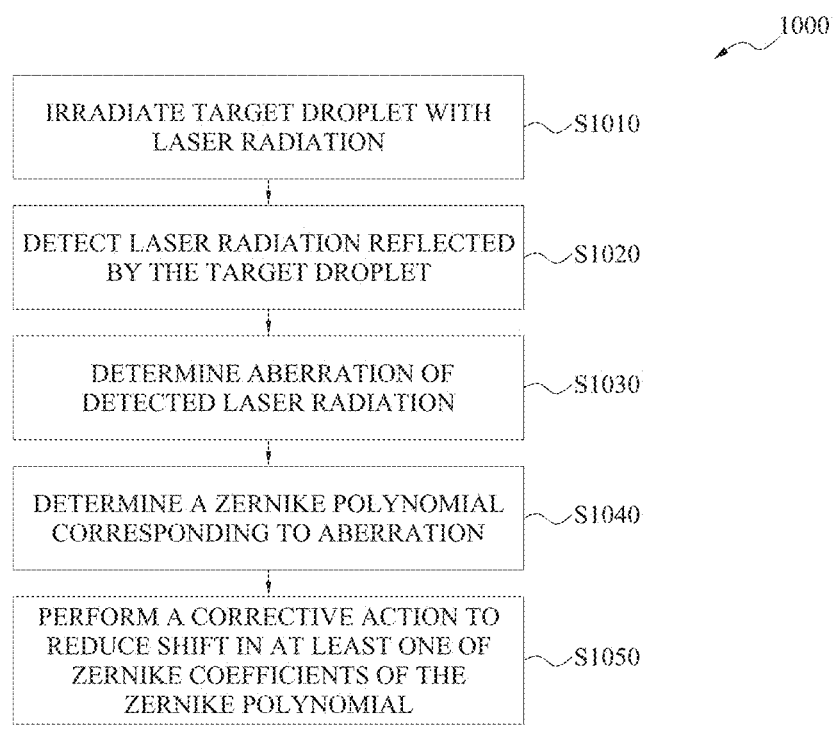
FIG. 10 illustrates a flow-chart of a method of controlling an extreme ultraviolet (EUV) lithography system, in accordance with an embodiment of the present disclosure.

An embodiment of the present disclosure is a method 1000 of operating an extreme ultraviolet (EUV) lithography system according to the flowchart illustrated in FIG. 10. It is understood that additional operations can be provided before, during, and after processes discussed in FIG. 10, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1010 of irradiating a target droplet with laser radiation. In operation S1020, laser radiation reflected by the target droplet is detected. In operation S1030, aberration of the detected laser radiation is determined. In operation S1040, a Zernike polynomial corresponding to the aberration is determined. In operation S1050, a corrective action is performed to reduce a shift in at least one of Zernike coefficients of the Zernike polynomial.

Figure 11:
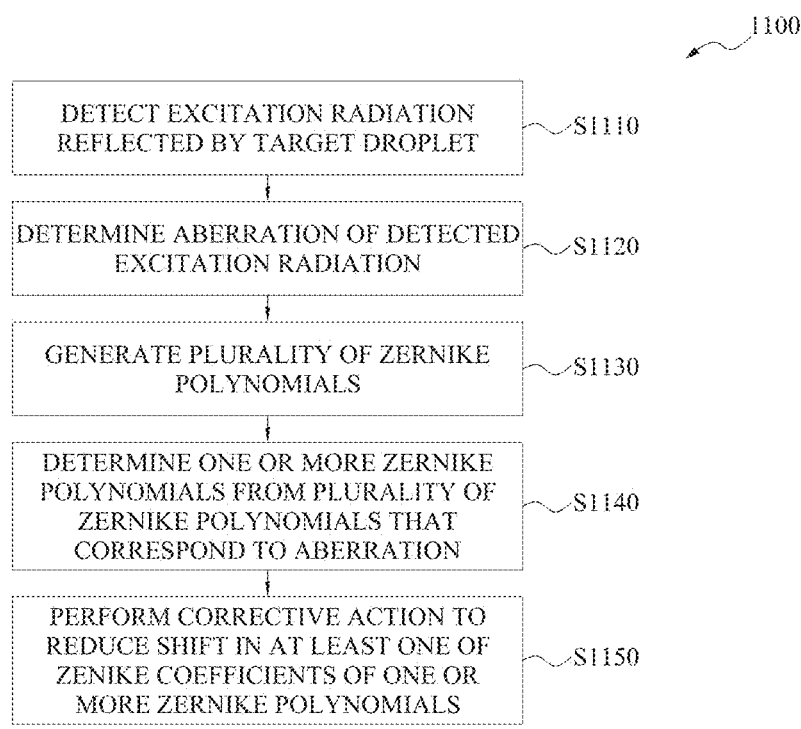
FIG. 11 illustrates a flow-chart of a method of controlling an extreme ultraviolet (EUV) lithography system, in accordance with an embodiment of the present disclosure.

Another embodiment of the present disclosure is a method 1100 of operating an extreme ultraviolet (EUV) lithography system according to the flowchart illustrated in FIG. 11. It is understood that additional operations can be provided before, during, and after processes discussed in FIG. 11, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1110 of detecting excitation radiation reflected by a target droplet generated by a droplet generator of the EUV lithography system. The EUV lithography system also includes an EUV radiation source for generating EUV radiation that includes an excitation radiation source. The excitation radiation from the excitation radiation source interacts with the target droplet. In operation S1120, aberration of the detected excitation radiation is determined. In operation S1130, a plurality of Zernike polynomials are generated. In operation S1140, one or more Zernike polynomials from the plurality of Zernike polynomials that correspond to the aberration are determined. In operation S1150, a corrective action is performed to reduce a shift in at least one of Zernike coefficients of the one or more Zernike polynomials.

Figure 12:
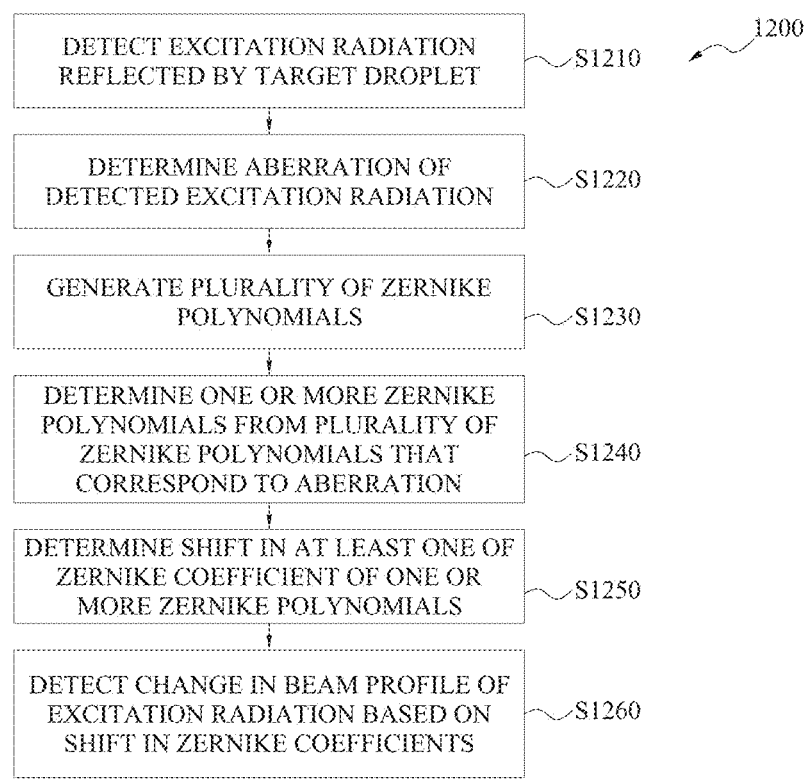
FIG. 12 illustrates a flow-chart of a method of controlling an extreme ultraviolet (EUV) lithography system, in accordance with an embodiment of the present disclosure.

Another embodiment of the present disclosure is a method 1200 of operating an extreme ultraviolet (EUV) lithography system according to the flowchart illustrated in FIG. 12. It is understood that additional operations can be provided before, during, and after processes discussed in FIG. 12, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1210 of detecting excitation radiation reflected by a target droplet generated by a droplet generator of the EUV lithography system. In operation S1220, aberrations of the detected excitation radiation are determined. In operation S1230, a plurality of Zernike polynomials are generated. In operation S1240, one or more Zernike polynomials from the plurality of Zernike polynomials that correspond to the aberration are determined. In operation S1250, a shift in at least one of Zernike coefficients of the one or more Zernike polynomials is determined. In operation S1260, a change in a beam profile of the excitation radiation based on the shift in the Zernike coefficients is detected.

According to one aspect of the present disclosure, a method of controlling an extreme ultraviolet (EUV) lithography system includes irradiating a target droplet with laser radiation and detecting laser radiation reflected by the target droplet. The method also includes determining aberration of the detected laser radiation, determining a Zernike polynomial corresponding to the aberration, and performing a corrective action to reduce a shift in at least one of Zernike coefficients of the Zernike polynomial. In one or more other embodiments, the corrective action includes generating a control signal to actuate one or more components of the EUV lithography system to adjust an interaction between the laser radiation and the target droplet. In one or more other embodiments, the interaction between the laser radiation and the target droplet is adjusted by changing a position of a droplet generator of the EUV lithography system, changing a trajectory of the laser radiation, or both. In one or more other embodiments, the one or more component includes an actuator and adjusting the interaction between the laser radiation and the target droplet includes controlling a focal point of laser radiation using the actuator. In one or more other embodiments, the actuator is connected to a steerable mirror, and the corrective action includes adjusting the steerable mirror using the actuator to adjust an interaction between the laser radiation and the target droplet. In one or more other embodiments, the corrective action includes adjusting an angle of incidence of the laser radiation. In one or more other embodiments, the method further includes generating a plurality of Zernike polynomials, and selecting the Zernike polynomial from the plurality of Zernike polynomials. The selected Zernike polynomials correspond to the aberration. In one or more other embodiments, the method further includes detecting a change in a beam profile of the EUV radiation based on the shift in the Zernike coefficients. In one or more other embodiments, the method further includes generating a control signal corresponding to the change in the beam profile, controlling an actuator of the EUV lithography system using the control signal, and adjusting a steerable mirror of the EUV lithography system using the actuator to change an optical path of the laser radiation. In one or more other embodiments, the shift in the Zernike coefficients is reduced such that EUV energy generated by an interaction of the laser radiation and target droplet is increased. In one or more other embodiments, the laser radiation includes a $CO_2$ laser.

According to yet another aspect of the present disclosure, an apparatus for extreme ultraviolet (EUV) lithography includes a droplet generator configured to generate target droplets, and an EUV radiation source for generating EUV radiation including an excitation radiation source. The excitation radiation from the excitation radiation source interacts with the target droplets. The apparatus also includes a final focus module that is configured to detect excitation radiation reflected by the target droplet, determine aberration of the detected excitation radiation, generate a plurality of Zernike polynomials, determine one or more Zernike polynomials from the plurality of Zernike polynomials that correspond to the aberration, and perform a corrective action to reduce a shift in at least one of Zernike coefficients of the one or more Zernike polynomials. In one or more other embodiments, the apparatus further includes a steerable mirror. The steerable mirror is a last mirror in an optical path of the excitation radiation before the excitation radiation interacts with the target droplet. The apparatus also includes an actuator configured to control the steerable mirror. The final focus module is further configured to adjust the steerable mirror using the actuator to adjust an interaction between the excitation radiation and the target droplet. In one or more other embodiments, the steerable mirror is adjustable in 3 axis. In one or more other embodiments, the final focus module is further configured to detect a change in a beam profile of the excitation radiation based on the shift in the Zernike coefficients. In one or more other embodiments, the final focus module is further configured to reduce the shift in the Zernike coefficients such that EUV energy generated by an interaction of the excitation radiation and target droplet is increased.

According to another aspect of the present disclosure, a non-transitory, computer-readable medium includes computer readable instructions stored in a memory which, when executed by a processor of a computer direct the computer to control a final focus module of an extreme ultraviolet (EUV) lithography apparatus to perform a method. The method includes detecting excitation radiation reflected by a target droplet, determining aberration of the detected excitation radiation, generating a plurality of Zernike polynomials, determining one or more Zernike polynomials from the plurality of Zernike polynomials that correspond to the aberration, determining a shift in at least one of Zernike coefficients of the one or more Zernike polynomials, and detecting a change in a beam profile of the excitation radiation based on the shift in the Zernike coefficients. In one or more other embodiments, the method further includes generating a control signal corresponding to the change in the beam profile, controlling an actuator of the EUV lithography system using the control signal, adjusting a steerable mirror of the EUV lithography system using the actuator to change an optical path of the excitation radiation. In one or more other embodiments, the steerable mirror is a last mirror in the optical path before the excitation radiation hits the target droplet. In one or more other embodiments, the steerable mirror is adjustable in 3 axis.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of controlling an extreme ultraviolet (EUV) lithography system, the method comprising:
    irradiating a target droplet with laser radiation;
    detecting laser radiation reflected by the target droplet;
    determining aberration of the detected laser radiation;
    determining a Zernike polynomial corresponding to the aberration; and
    performing a corrective action to reduce a shift in at least one of Zernike coefficients of the Zernike polynomial.

2. The method of claim 1, wherein the corrective action includes generating a control signal to actuate one or more components of the EUV lithography system to adjust an interaction between the laser radiation and the target droplet.

3. The method of claim 2, wherein the interaction between the laser radiation and the target droplet is adjusted by changing a position of a droplet generator of the EUV lithography system, changing a trajectory of the laser radiation, or both.

4. The method of claim 3, wherein the actuator is connected to a steerable mirror, and the corrective action includes adjusting the steerable mirror using the actuator to adjust an interaction between the laser radiation and the target droplet.

5. The method of claim 2, wherein the one or more component includes an actuator and adjusting the interaction between the laser radiation and the target droplet includes controlling a focal point of laser radiation using the actuator.

6. The method of claim 1, wherein the corrective action includes adjusting an angle of incidence of the laser radiation.

7. The method of claim 1, further comprising:
    generating a plurality of Zernike polynomials; and
    selecting the Zernike polynomial from the plurality of Zernike polynomials, the selected Zernike polynomial corresponding to the aberration.

8. The method of claim 1, further comprising detecting a change in a beam profile of the EUV radiation based on the shift in the Zernike coefficients.

9. The method of claim 8, further comprising:
    generating a control signal corresponding to the change in the beam profile;
    controlling an actuator of the EUV lithography system using the control signal; and
    adjusting a steerable mirror of the EUV lithography system using the actuator to change an optical path of the laser radiation.

10. The method of claim 1, wherein the shift in the Zernike coefficients is reduced such that EUV energy generated by an interaction of the laser radiation and target droplet is increased.

11. The method of claim 1, wherein the laser radiation includes a $CO_2$ laser.

12. An apparatus for extreme ultraviolet (EUV) lithography, comprising:
    a droplet generator configured to generate target droplets;
    an EUV radiation source for generating EUV radiation including an excitation radiation source, excitation radiation from the excitation radiation source interacting with the target droplets; and
    a final focus module configured to:
        detect the excitation radiation reflected by the target droplet;
        determine aberration of the detected excitation radiation;
        generate a plurality of Zernike polynomials;
        determine one or more Zernike polynomials from the plurality of Zernike polynomials that correspond to the aberration; and
        perform a corrective action to reduce a shift in at least one of Zernike coefficients of the one or more Zernike polynomials.

13. The apparatus of claim 12, further comprising:
    a steerable mirror, the steerable mirror being a last mirror in an optical path of the excitation radiation before the excitation radiation interacts with the target droplet; and
    an actuator configured to control the steerable mirror, wherein the final focus module is further configured to adjust the steerable mirror using the actuator to adjust an interaction between the excitation radiation and the target droplet.

14. The apparatus of claim 13, wherein the steerable mirror is adjustable in 3 axis.

15. The apparatus of claim 12, wherein the final focus module is further configured to detect a change in a beam profile of the excitation radiation based on the shift in the Zernike coefficients.

16. The apparatus of claim 12, wherein the final focus module is further configured to reduce the shift in the Zernike coefficients such that EUV energy generated by an interaction of the excitation radiation and target droplet is increased.

17. A non-transitory, computer-readable medium comprising computer readable instructions stored in a memory which, when executed by a processor of a computer direct the computer to control a final focus module of an extreme ultraviolet (EUV) lithography apparatus to perform a method, the method comprising:
    detecting excitation radiation reflected by a target droplet;
    determining aberration of the detected excitation radiation;
    generating a plurality of Zernike polynomials;
    determining one or more Zernike polynomials from the plurality of Zernike polynomials that correspond to the aberration;
    determining a shift in at least one of Zernike coefficients of the one or more Zernike polynomials; and detecting a change in a beam profile of the excitation radiation based on the shift in the Zernike coefficients.

18. The non-transitory, computer-readable medium of claim 17, wherein the method further comprises:
   generating a control signal corresponding to the change in the beam profile;
   controlling an actuator of the EUV lithography system using the control signal; and
   adjusting a steerable mirror of the EUV lithography system using the actuator to change an optical path of the excitation radiation.

19. The non-transitory, computer-readable medium of claim 18, wherein the steerable mirror is a last mirror in the optical path before the excitation radiation hits the target droplet.

20. The non-transitory, computer-readable medium of claim 19, wherein the steerable mirror is adjustable in 3 axis.

\* \* \* \* \*